(12) United States Patent
Ueda et al.

(10) Patent No.: US 7,508,001 B2
(45) Date of Patent: Mar. 24, 2009

(54) SEMICONDUCTOR LASER DEVICE AND MANUFACTURING METHOD THEREOF

(75) Inventors: Tetsuzo Ueda, Toyonaka (JP); Masaaki Yuri, Ibaraki (JP)

(73) Assignee: Panasonic Corporation, Osaka (JP)

( * ) Notice: Subject to any disclaimer, the term of this patent is extended or adjusted under 35 U.S.C. 154(b) by 532 days.

(21) Appl. No.: 11/154,807

(22) Filed: Jun. 17, 2005

(65) Prior Publication Data

US 2005/0280022 A1  Dec. 22, 2005

(30) Foreign Application Priority Data

Jun. 21, 2004  (JP) ............................. 2004-182652

(51) Int. Cl.
*H01L 27/15* (2006.01)
*H01L 31/12* (2006.01)
*H01L 33/00* (2006.01)

(52) U.S. Cl. ............................. 257/79; 257/84; 257/96; 438/27; 438/44

(58) Field of Classification Search ............... 257/79, 257/84, 96, 190; 438/27, 44, 47, 481
See application file for complete search history.

(56) References Cited

U.S. PATENT DOCUMENTS

| | | | |
|---|---|---|---|
| 6,320,209 B1* | 11/2001 | Hata et al. ................... | 257/190 |
| 7,120,181 B1* | 10/2006 | Hayashi et al. ........... | 372/46.01 |
| 2004/0159848 A1* | 8/2004 | Yamaguchi et al. ............ | 257/94 |
| 2004/0262624 A1* | 12/2004 | Akita et al. .................... | 257/90 |

FOREIGN PATENT DOCUMENTS

| | | |
|---|---|---|
| EP | 1998 0851542 | 7/1998 |
| JP | 4-370993 | 12/1992 |
| JP | 8-097507 | 4/1996 |
| JP | 9-191160 | 7/1997 |
| JP | 9-283854 | 10/1997 |
| JP | 9-298343 | 11/1997 |
| JP | 10-027940 | 1/1998 |

(Continued)

OTHER PUBLICATIONS

English Language Abstract of JP 4-370993.

(Continued)

*Primary Examiner*—Phuc T Dang
(74) *Attorney, Agent, or Firm*—Greenblum & Bernstein, P.L.C.

(57) ABSTRACT

The present invention aims to provide a long-lived semiconductor laser device with low threshold current and available for high-output operation in a blue-violet semiconductor laser device using a nitride semiconductor layer. In the semiconductor laser device, the following layers are sequentially formed on a GaN substrate 1: an n-type GaN layer 2; an n-type AlGaN cladding layer 3, a first n-type GaN guiding layer 4; and a p-type AlGaN blocking layer 6 (current-blocking layer), further a striped opening is formed on a portion of the p-type AlGaN blocking layer 6, a second n-type GaN guiding layer 5 is formed to cover the opening, and the following layers are sequentially formed on the second n-type GaN guiding layer 5: an InGaN multiple quantum well active layer 7; an undoped GaN guiding layer 8; a p-type AlGaN electron overflow suppression layer 9, a p-type AlGaN cladding layer 10, and a p-type GaN contact layer 11.

21 Claims, 5 Drawing Sheets

FOREIGN PATENT DOCUMENTS

| | | |
|---|---|---|
| JP | 10-027947 | 1/1998 |
| JP | 10-084165 | 3/1998 |
| JP | 10-190142 | 7/1998 |
| JP | 11-017277 | 1/1999 |
| JP | 2000-151022 | 5/2000 |
| JP | 2000-156524 | 6/2000 |
| JP | 2000-200946 | 7/2000 |
| JP | 2000-315838 | 11/2000 |
| JP | 2001-077470 | 3/2001 |
| JP | 2001-077471 | 3/2001 |
| JP | 2001-077473 | 3/2001 |
| JP | 2002-291930 | 10/2001 |
| JP | 2002-026456 | 1/2002 |
| JP | 2002-198314 | 7/2002 |
| JP | 2003-008145 | 1/2003 |

OTHER PUBLICATIONS

English Language Abstract of JP 8-097507.
English Language Abstract of JP 9-191160.
English Language Abstract of JP 9-283854.
English Language Abstract of JP 9-298343.
English Language Abstract of JP 10-027940.
English Language Abstract of JP 10-027947.
English Language Abstract of JP 10-084165.
English Language Abstract of JP 10-190142.
English Language Abstract of JP 11-17277.
English Language Abstract of JP 2000-151022.
English Language Abstract of JP 2000-156524.
English Language Abstract of JP 2000-315838.
English Language Abstract of JP 2001-077470.
English Language Abstract of JP 2001-077471.
English Language Abstract of JP 2001-077473.
English Language Abstract of JP 2002-291930.
English Language Abstract of JP 2002-026456.
English Language Abstract of JP 2002-198314.
English Language Abstract of JP 2003-008145.
Imafuji et al., "600 mW CW Single-Mode GaAlAs Triple-Quantum-Well Laser with a New Index Guided Structure," IEEE Journal of Quantum Electronics, vol. 29, No. 6, pp. 1889-1894 (1993).

* cited by examiner

Prior Art

SEMICONDUCTOR LASER DEVICE AND MANUFACTURING METHOD THEREOF

BACKGROUND OF THE INVENTION (1) Field of the Invention

The present invention relates to a semiconductor laser device applicable to a blue-violet semiconductor laser device used for, for example, a light source for writing and reading of a high density optical disc, and a manufacturing method thereof.

(2) Description of the Related Art

A III-V group compound semiconductor laser device has been widely used as a light source for reading and writing of an optical disc such as a Compact Disk (CD) and a Digital Versatile Disk (DVD). As the optical disc becomes denser, a wavelength of the light source needs to be shortened. Therefore, the wavelength of 780 nm in an infrared region has been shifted to that of 650 nm in a read region. In order to realize further densification, a light source having a short wavelength is necessary. Here, a GaN III-V group nitride semiconductor (indicated as InGaAlN) is expected as a material to realize the above. A blue-violet laser device with several 10 mW output has already been commercially manufactured. For the realization of a next generation high-density optical disc system (Blu-ray Disc), a research and development has been actively pursued. In the optical disc system, it is a necessity for the high-speed writing operation to increase the outputs from the light source. Therefore, a research and development has also been actively conducted for realizing a high-output GaN semiconductor laser device that is made of the GaN III-V group nitride semiconductor.

In general, the semiconductor laser device used for the optical disc system has a striped waveguide in which light is confined and which is positioned closely to an active layer that generates light emission, and a resonator mirror formed by cleavage. As factors of preventing the semiconductor laser device from increasing outputs, the following problems are assumed: an end-face destruction; a kink caused by hole burning (observed in current-light output characteristics); an output saturation by a heat generation; and the like. Thus, the output of the conventional infrared/red semiconductor laser device has been increased by solving these problems. On the other hand, in the present GaN blue-violet semiconductor laser device that is expected the use for the next generation, a development of a waveguide structure in order to raise the kink level is mainly the most difficult problem rather than the problems of the end-face destruction and the heat generation. Therefore, the development for increasing outputs has been pursued by designing a dimension of the waveguide structure and controlling the structure.

The following describes a laser structure of a ever-reported high-output infrared semiconductor laser device and an example of the laser structure of the high-output infrared semiconductor laser device applied to the GaN blue-violet semiconductor laser device.

FIG. 1 is a cross-section diagram showing a laser structure of the GaAs infrared semiconductor laser device in a related art.

The GaAs infrared semiconductor laser device is made up of an n-type GaAs substrate 23, an n-type AlGaAs cladding layer 24, an undoped-AlGaAs active layer 25, a first p-type AlGaAs cladding layer 26, an n-type AlGaAs blocking layer 27, a second p-type AlGaAs cladding layer 28, a p-type GaAs contact layer 29, an AuGeNi/Au ohmic electrode 30, and a Ti/Pt/Au ohmic electrode 31.

In the GaAs infrared semiconductor laser device, the high-output operation is realized by controlling light confinement in the waveguide by precisely controlling the alloy ratio of AlGaAs or GaAs using epitaxial regrowth technology. The following layers are sequentially formed on the n-type GaAs substrate 23: the n-type AlGaAs cladding layer 24; the undoped AlGaAs active layer 25; and a portion of the p-type AlGaAs cladding layer that is the first p-type AlGaAs cladding layer 26. On the first p-type AlGaAs cladding layer 26, the n-type AlGaAs blocking layer 27 is formed so as to have a striped opening. On the opening, the rest of the P-type AlGaAs cladding layer that is the second p-type AlGaAs cladding layer 28 and the p-type GaAs contact layer 29 is formed. The AuGeNi/Au ohmic electrode 30 is formed on the rear surface of the n-type GaAs substrate 23. The Ti/Pt/Au ohmic electrode 31 is formed on the p-type GaAs contact layer 29. The light is confined in the striped area because the refractive index of the second p-type AlGaAs cladding layer 28 formed by the regrowth is larger than that of the n-type AlGaAs blocking layer 27. Herein, the light is blocked at the n-type AlGaAs blocking layer so that the GaAs infrared semiconductor laser device has a real refractive index waveguide-type structure with small internal loss. Therefore, low threshold current and high-output operation are realized in the structure (refer to Japanese Laid-Open Patent Publication No. 4-370993 and IO. Imafuji et al., IEEE J. Quantum Electron. QE-29, 1993, p. 1889).

FIG. 2 is a cross-section diagram of the GaN blue-violet semiconductor laser device for explaining the laser structure in the example that the laser structure of the high-output GaAs infrared semiconductor laser device is applied to the GaN blue-violet semiconductor laser device. For example, it is disclosed in Japanese Laid-Open Patent Publications No. 8-97507 and No. 10-027947.

The GaN blue-violet semiconductor laser device is made up of an n-type GaN layer 2, an n-type AlGaN cladding layer 3, an InGaN multiple quantum well active layer 7, a p-type GaN contact layer 11, a Ti/Al/Ni/Au ohmic electrode 12, a Ti/Au pad electrode 14, a Sapphire substrate 16, a Ni/Au electrode 32, a first p-type AlGaN cladding layer 33, an n-type AlGaN blocking layer 34, and a second p-type AlGaN cladding layer 35.

In the GaN blue-violet semiconductor laser device, similar to the GaAs infrared semiconductor laser device shown in FIG. 1, the p-type cladding layer is re-grown on a portion of the p-type cladding layer, and the light confinement in the waveguide is controlled by precisely controlling the alloy ratio of AlGaN. Therefore, a low threshold current operation and a high-output operation can be realized in the GaN blue-violet semiconductor laser device.

SUMMARY OF THE INVENTION

However, in the GaN blue-violet semiconductor laser device having the regrowth process shown in FIG. 2 and the manufacturing method thereof, the problem of concentration distribution is caused that the concentration of Mg included in the P-type AlGaN layer becomes higher or lower around a regrowth interface. In the p-type AlGaN layer, the resistivity depends on the Mg concentration. If the concentration exceeds in the $5\times10^{19} cm^{-3}$ range, the resistivity becomes suddenly high. Therefore, by redistributing Mg around the interface, an area of high resistivity is formed on the interface. Accordingly, the GaN blue-violet semiconductor laser device and the manufacturing method thereof have a problem to cause high series resistance and high operational voltage. In other words, the power consumption becomes large due to the high operational voltage. Therefore, there is a problem that the longevity is difficult to be achieved. With such background, as the conventional GaN blue-violet laser device, a semiconductor laser device having the following laser structure has been reported. In the laser structure, without using a regrowth process, a ridge is formed on the p-type AlGaN cladding layer after epitaxially growing layers up to p-type layers, for example, a $SiO_2$ passivation film is formed around the periphery of the ridge, and a waveguide is formed by confining light using a difference of refractive indexes between the $SiO_2$ passivation film and the p-type AlGaN cladding layer.

Considering the above-mentioned technical problems, an object of the present invention is to provide a long-lived semiconductor laser device which allows low threshold current operation and high-output operation and the manufacturing method thereof.

In order to solve the problems, the semiconductor laser device of the present invention has the following structure.

In other words, a semiconductor laser device according to the present invention comprises: a substrate; a current-blocking layer which has an opening and is formed above said substrate, said current-blocking layer being one of a p-type layer and a semi-insulating layer; an n-type semiconductor layer formed at least in the opening; and a light-emitting layer formed above said current-blocking layer.

With this structure, by determining the current-blocking layer as the p-type layer and the semiconductor layer as the n-type when the n-type is used for the substrate, the semiconductor laser device can be formed by re-growing an n-type semiconductor layer on an n-type semiconductor layer. Therefore, the interface resistance at the regrowth interface can be reduced and the semiconductor laser device which can operate with small series resistance and perform low-current operation can be realized. Also, the semiconductor laser device which can operate with low threshold current and increase outputs is realized because it can have a real refractive index guided wave type structure with small optical internal loss.

Specifically, the GaN semiconductor laser device of the present invention has a structure in which a first n-type GaN guiding layer and a p-type AlGaN blocking layer (current-blocking layer) are formed on the substrate, a striped opening is further formed in a portion of the p-type AlGaN blocking layer, and a second n-type GaN guiding layer and an InGaN multiple quantum well active layer are formed so as to cover the opening.

With this structure, the light is confined at the side of the second n-type GaN guiding layer by the difference of refractive indexes of the p-type AlGaN blocking layer and the second n-type GaN guiding layer, and a waveguide of the blue-violet semiconductor laser device is formed in the striped opening of the p-type AlGaN blocking layer formed by etching in which the second n-type GaN guiding layer is embedded. Herein, by re-growing the second n-type GaN guiding layer on the first n-type GaN guiding layer, the resistance at the regrowth interface is lowered compared to the case where a p-type layer is re-grown on another p-type layer, and the electrode area can be increased on the p-type GaN layer in comparison with in the right-type semiconductor laser device. Therefore, the series resistance is lowered and the low-current operation can be realized. Further, the difference of refractive indexes between the second n-type GaN guiding layer and the p-type AlGaN blocking layer in the striped opening can be controlled precisely in the $10\ cm^{-3}$ range by changing the Al composition of the p-type AlGaN blocking layer. Therefore, the generation of kink in the current—light output characteristics at the time of high-output operation is controlled and a design margin for obtaining a stable high-output single transverse mode laser can be increased. Further, by precisely controlling the difference of the refractive indexes, in the case where a this structure is applied to a low-noise semiconductor laser device of self-oscillation type, the design margin of the semiconductor laser device can be increased.

A top surface of said semiconductor layer is plane, and said light-emitting layer is formed on said semiconductor layer, contacting with said semiconductor layer.

In this structure, there are no steps and asperities in the face of the semiconductor layer in which the light-emitting layer is formed so that the reproducibility of the horizontal divergence angle is increased. Therefore, a Far Field Pattern with good reproducibility can be obtained when it is used as a light source of the optical disc system and the like.

Said current-blocking layer is preferred to have a smaller refractive index than said semiconductor layer.

With this structure, the waveguide of the semiconductor laser device can be formed by confining the light in the opening by the difference of refractive indexes between the current-blocking layer having the striped opening and the light-guiding layer. The difference of the refractive indexes then can be precisely controlled in the $10^{-3}$ cm range by changing the film composition of the current-blocking layer. Therefore, the generation of kink in the current—light output characteristics at the time of high-output operation is controlled and a design margin for obtaining a stable high-output single transverse mode laser can be increased. Further, by precisely controlling the difference of the refractive indexes, in the case where a this structure is applied to a low-noise semiconductor laser device of self-oscillation type, the design margin of the semiconductor laser device can be increased.

Said current-blocking layer is preferred to have an area into which two or more types of impurities are doped.

With this structure, the light loss due to the absorption in the current-blocking layer can be controlled while keeping electrical separations. Therefore, the design margin of a high-output or low-noise semiconductor laser device can be increased.

Said current-blocking layer is preferred to be made up of layers which have compositions that are different from each other.

With this structure, for example in the case where the current-blocking layer is made of AlGaN, its top layer is made of AlGaN whose Al composition is large and the diffusion of Mg that is a p-type impurity doped in the light-guiding layer above the current-blocking layer or the active layer can be restrained. Therefore, the light emission efficiency is increased and the semiconductor laser device which can operate with low operational current can be realized.

It is preferred for the semiconductor laser device of the present invention to have the concentration of impurity doped in the current-blocking layer of $10^{16} cm^{-3}$ or less in the semiconductor layer.

With this structure, the semiconductor laser device which can operate with low operational current can be realized by restraining the impurity diffusion in the active layer and increasing the light-emission efficiency.

Said semiconductor layer includes: a first semiconductor layer; and a second semiconductor layer formed on said first semiconductor layer, contacting with said first semiconductor layer, said first semiconductor layer is formed between said current-blocking layer and said substrate, said second semiconductor layer is formed between said current-blocking layer and said light-emitting layer, and is formed inside the opening, and said first semiconductor layer has a higher impurity concentration on a side of said light-emitting layer than on a side of said substrate.

With this structure, the impurity concentration becomes high on the surface of the first semiconductor layer which re-grows through the opening. As the result, an area having small carrier concentration and few impurities is not formed due to the redistribution of the impurities at the time of regrowth. Consequently, the interface resistance can be further reduced at the regrowth interface and the semiconductor laser device which can operate with small series resistance and perform low voltage operation can be realized.

It is preferred that a composition of said first semiconductor layer is different from a composition of said second semiconductor layer.

With this structure, the semiconductor laser which can operate with low operational current can be realized, when the current-blocking layer is made of AlGaN, by determining the top layer of the current-blocking layer is made of AlGaN with a large Al composition, restraining for example the diffusion of Mg that is a p-type impurity doped in an upper light-guiding layer or the active layer, and increasing the light emission efficiency. Also, the light confinement coefficient in a vertical direction can be increased so that the semiconductor laser device which can operate with low threshold current can be realized.

It is preferred that impurity concentrations of said first semiconductor layer and said second semiconductor layer reach a peak at an interface between said first and second semiconductor layers.

With this structure, in the case where the first and second semiconductor layers are respectively made of, for example, GaN or InGaN for Si doping and the crystal growth is performed by adjusting the amount of Si doping so as to have higher concentration at the top surface of the first semiconductor layer, the first and second semiconductor layers can be formed so as to have a peak of the Si concentration distribution near the regrowth interface. Consequently, the interface resistance can be reduced so that the semiconductor laser device which operates with series resistance and low operational voltage can be realized.

It is preferred for the semiconductor laser device of the present invention to have a semiconductor layer in which the opening of the current-blocking layer is formed above the area having the crystal defection density of $10^7 cm^{-2}$ or less.

With this structure, the active layer and the waveguide of the semiconductor laser device can be formed in an area having the crystal defection density of $10^7 cm^{-2}$ or less. Therefore, a further long-lived semiconductor laser device can be realized.

Said light-emitting layer and said semiconductor layer are preferred to be made of a compound semiconductor including nitrogen.

With this structure, a long-lived blue-violet semiconductor laser device which operate with small series resistance and perform low-voltage operation can be realized.

It is desired for the semiconductor laser device of the present invention to have a structure in which Si is doped further in the semiconductor layer.

With this structure, for example, a GaN semiconductor laser device can be formed by re-growing an n-type layer including Si as an impurity on an n-type layer including Si as an impurity. Accordingly, the semiconductor laser device can be formed using a low-resistant n-type GaN semiconductor layer and a blue-violet semiconductor laser device which operate with small series resistance and perform low voltage operation can be realized.

It is preferred for the semiconductor laser device of the present invention to have a structure including an area in which the Si concentration is $1\times10^{18} cm^{-3}$ or more.

With this structure, the semiconductor laser device which operates with further small series resistance and operational voltage can be realized.

It is preferred that said current-blocking layer is doped with magnesium.

With this structure, for example in the GaN semiconductor laser device, the p-type GaN semiconductor layer having higher carrier concentration can be used as a current-blocking layer so that the current can be narrowed in the opening of the current-blocking layer. Further, the difference of refractive indexes can be precisely controlled in the $10^{-3}$ range by changing the film composition of the current-blocking layer. Therefore, the generation of kink in the current—light output characteristics at the time of high-output operation is restrained and a design margin for obtaining a stable high-output single transverse mode laser can be increased. Further, by precisely controlling the difference of the refractive indexes, in the case where this structure is applied to a low-noise semiconductor laser device of a self-oscillation type, the design margin of the semiconductor laser device can be increased.

It is preferred that a concentration of the magnesium in said current-blocking layer is $1\times10^{19} cm^{-3}$ or less.

With this structure, a point defection occurs in the p-type GaN layer or the p-type AlGaN layer can be restrained so that the Mg diffusion concentration in an active layer is restrained while improving crystallinity of the active layer formed above the current blocking layer and the light emission efficiency of the active layer is improved as the result. Thus, a semiconductor laser device with low operational current can be realized.

It is preferred that said semiconductor layer is made of GaN.

With this structure, in the case where the current-blocking layer is made of AlGaN, the AlGaN which makes of the current-blocking layer has a smaller refractive index than GaN which makes of the semiconductor layer so that the current can be narrowed in an area of the opening of the current-blocking layer. Further, the difference of the refractive indexes can be precisely controlled in the $10^{-3}$ range by controlling the Al composition of the current-blocking layer so that the design margin for obtaining a high-output blue-violet semiconductor laser device and a low-noise blue-violet semiconductor laser device can be increased.

It is preferred that said light-emitting layer is made of InGaAlN, and said light-emitting layer has a larger Al composition in an area positioned above said current-blocking layer than in an area positioned above the opening.

With this structure, in the case where for example the blue-violet semiconductor laser device having a light-emitting layer of a multiple quantum well structure made of AlGaN is formed by a MOCVD method and a light-guiding layer and a light-emitting layer are formed by regrowth from the opening of the current-blocking layer, at the time of an embedded regrowth, Ga migrates near the opening and the Al composition of the light-emitting layer becomes small near the opening as the result. Accordingly, the light is more likely to be confined in the light-emitting layer above the opening. Therefore, a large light confinement can be realized efficiently in a thinner current-blocking layer and a blue-violet semiconductor laser device with low threshold can be realized.

Said light-emitting layer is preferred to have a smaller In composition in the area positioned above said current-blocking layer than in the area positioned above the opening.

With this structure, in the case where for example the blue-violet semiconductor laser device having a light-emitting layer of a multiple quantum well structure made of InGaN is formed by a MOCVD method and a light-guiding layer and a light-emitting layer are formed by regrowth from the opening of the current-blocking layer, at the time of an embedded regrowth, In migrates near the opening and the In composition of the light-emitting layer becomes small near the opening as the result. Accordingly, a semiconductor laser device with longer wave length can be formed with smaller amount of In material. Further, the In composition is reduced on the current-blocking layer and a lattice-mismatching with the base of AlGaN or GaN can be reduced so that a light-emitting layer with smaller crystal defection can be realized.

It is preferred for the semiconductor laser device of the present invention to further include Mg and Si in the current-blocking layer.

With this structure, the loss of light at the current-blocking layer due to the absorption is controlled while keeping the electric separations and the design margin of a high-output and low-noise semiconductor laser device can be increased.

It is preferred for the semiconductor laser device of the present invention to have a structure in which the substrate is made of one of Sapphire, SiC, GaN, AlN, MgO, $LiGaO_2$, $LiAlO_2$, and an alloy of $LiGaO_2$ and $LiAlO_2$.

With this structure, a GaN semiconductor epitaxial growth layer with good crystallinity can be formed on a substrate so that a blue-violet semiconductor laser device which operates with smaller series resistance and performs low voltage operation can be realized.

It is preferred that said first semiconductor layer is made of $In_xGa_{1-x}N$, where $0 \leq x \leq 1$, and said second semiconductor layer is made of GaN.

With this structure, since InGaN has a higher refractive index than GaN, the light confinement coefficient in a vertical direction can be increased by using InGaN in the semiconductor layer so that the semiconductor laser device with low threshold current can be realized.

Said current-blocking layer is preferred to be made up of a first $Al_xGa_{1-x}N$ layer and a second $Al_yGa_{1-y}N$ layer formed on the first $Al_xGa_{1-x}N$ layer, where $0 \leq x \leq 1$, $0 \leq y \leq 1$ and $x<y$.

With this structure, the diffusion of Mg doped in an AlGaN layer whose Al composition is small can be restrained by for example increasing the Al composition of the first AlGaN layer or the second AlGaN layer. Therefore, the semiconductor laser device with low operational current can be realized by improving the light-emission efficiency by restraining the diffusion of Mg in the active layer.

Said current-blocking layer may be made of $Al_xGa_{1-x}N$ layer, where $0 \leq x \leq 1$.

With this structure, in the case where the semiconductor layer formed in the opening of the current-blocking layer is made of GaN or InGaN, the AlGaN which makes of the current-blocking layer has a smaller refractive index than a material which makes of the semiconductor layer so that the current can be narrowed in an area of the opening of the current-blocking layer. Further, the difference of the refractive indexes can be precisely controlled in the $10^{-3}$ range by controlling the Al composition of the current-blocking layer. Therefore, the generation of kink in the current—light output characteristics at the time of high-output operation is controlled and a design margin for obtaining a stable high-output single transverse mode laser can be increased. Further, by precisely controlling the difference of the refractive indexes, in the case where this structure is applied to a low-noise semiconductor laser device of self-oscillation type, the design margin of the semiconductor laser device can be increased.

In the semiconductor laser device of the present invention, the light-emitting layer is further preferred to be made of a multiple quantum well having a quantum well of $In_xGa_{1-x}N$ ($0 \leq x \leq 1$).

With this structure, gains and light emission efficiency of the light-emitting layer which makes up of the semiconductor laser device can be efficiently increased. Therefore, for example, a blue-violet semiconductor laser device with low threshold current/low operational current can be realized.

It is preferred that said semiconductor layer functions as a cladding layer, and said semiconductor laser device further comprises a light-guiding layer formed between said light-emitting layer and said cladding layer, said light-guiding layer being made of $In_xGa_{1-x}N$, where $0 \leq x \leq 1$.

With this structure, in the case where the current-blocking layer is made of AlGaN, an efficiently large difference of refractive indexes between the current-blocking layer and the light-guiding layer can be obtained with a low Al composition. In general, in the case where the AlGaN layer with a high Al composition is formed by epitaxial growth, there is a problem that the growth speed is slow or a crack is likely to be generated. However, this structure can solve the problem and a current-blocking layer which has a high growth speed and is unlikely to cause a crack in a layer can be formed.

Said light-guiding layer is preferred to have a periodic structure in which InGaN and GaN are periodically arranged.

With this structure, the problem of degradation of crystallinity due to an In segregation that is a problem for forming the InGaN light-guiding layer is solved. Consequently, the internal loss of light in the InGaN light-guiding layer is reduced and, the blue-violet semiconductor laser device with low threshold current can be realized.

It is further preferred for the semiconductor laser device of the present invention to have a structure in which a cladding layer with a larger band gap than that of the semiconductor layer is formed under the semiconductor layer.

With this structure, the cladding layer formed under the semiconductor layer has a small refractive index and a vertical light confinement coefficient in the light-emitting layer can be larger. Consequently, the blue-violet semiconductor laser device with low threshold current can be realized.

It is preferred for the semiconductor laser device of the present invention to have the cladding layer that is made of $Al_xGa_{1-x}N$ ($0 \leq x \leq 1$).

With this structure, in the case where the light-guiding layer formed above the cladding layer in the waveguide of the semiconductor laser device is made of GaN or InGaN, the AlGaN has a smaller refractive index than the above so that the vertical light confinement coefficient can be larger in the light-emitting layer. Further, the light confinement coefficient can be precisely controlled by the Al composition of the cladding layer and controlling the thickness of AlGaN layer. Therefore, a blue-violet semiconductor laser device with good reproducibility and low threshold current can be realized.

A method of manufacturing a semiconductor laser device according to the present invention comprises: forming a first semiconductor layer above a substrate, forming a current-blocking layer on the first semiconductor layer; forming an opening in the current-blocking layer; forming a second semiconductor layer inside the opening; and forming a light-emitting layer above the second semiconductor layer.

With this structure, by defining the current-blocking layer as the p-type layer when the n-type substrate is used for the substrate and the first and second semiconductor layers as the n-type layer, the semiconductor laser device can be formed by re-growing an n-type semiconductor layer on an n-type semiconductor layer and the interface resistance at the regrowth interface can be reduced. Therefore, the semiconductor laser device which operates with small series resistance and performs low voltage operation can be realized.

It is preferred that said forming of the second semiconductor layer includes forming the second semiconductor layer so as to planarize a top surface of the semiconductor layer, and said forming of the light-emitting layer includes forming the light-emitting layer on the planarized surface of the second semiconductor layer.

With this structure, since there is no step or asperities on the surface of the semiconductor layer on which the light-emitting layer is formed, the reproducibility of light confinement in a horizontal direction is increased and the reproducibility of a far-field pattern in a horizontal direction can be increased. Further, a real refractive index guided wave type structure with small internal loss of light can be formed. Therefore, low threshold current and high output operation are realized in the structure.

It is preferred that said forming of the second semiconductor layer includes planarizing the surface of the second semiconductor layer by one of etching and polishing.

With this structure, while keeping plainness of the active layer, a thickness of the light-guiding layer formed between the active layer and the current-blocking layer is thinned so that the light confinement in a lateral direction can be easier to be controlled. Therefore, a design margin of a high-output/low-noise semiconductor laser device can be increased.

It is preferred that the current-blocking layer has a conductivity type that is one of p-type and semi-insulating type, said forming of the-current-blocking layer includes forming a portion of the current-blocking layer by forming a semiconductor layer in which an impurity is doped on the first semiconductor layer, and forming the rest of the current-blocking layer by forming a semiconductor layer in which an impurity is not doped on the portion of the current-blocking layer.

With this structure, for example, in the case where a supply of Mg source is stopped during the formation of the p-type AlGaN current-blocking layer and the rest of p-type AlGaN current-blocking layer is further formed, while the Mg doped in the p-type AlGaN current-blocking layer formed before the stop is diffused, there is no Mg on its top surface. As the result, the Mg diffusion to the light-guiding layer or the active layer can be restrained so that the light emission efficiency can be increased. Therefore, a semiconductor laser device with low operational current can be realized.

It is preferred for the manufacturing method of the present invention to further selectively form a mask having an opening on the substrate, form a current-blocking layer and a first semiconductor layer on the opening and the mask so as to start crystal growth from the opening, and form a light-emitting layer in the semiconductor laser device above the first semiconductor layer, and to have a crystal defects density of the active layer above the opening of $10^7 cm^{-2}$ or lower.

With this structure, the active layer and the waveguide of the semiconductor laser device can be formed in an area in which the crystal defects density is $10^7 cm^{-2}$ or lower. Therefore, a longer-lived semiconductor laser device can be realized.

It is preferred that the light-emitting layer, the first semiconductor layer and the second semiconductor layer are made of a compound semiconductor including nitrogen.

With this structure, a long-lived blue-violet semiconductor laser device which operates with small series resistance and performs low voltage operation can be realized In the manufacturing method of the semiconductor laser device of the present invention, the substrate on which the semiconductor laser device is formed may be made of one of SiC, GaN, AlN, MgO, $LiGaO_2$, $LiAlO_2$, and an alloy of $LiGaO_2$ and $LiAlO_2$.

With this structure, a GaN semiconductor epitaxial growth layer with good crystallinity can be formed on the substrate so that a blue-violet semiconductor laser device which operates with small series resistance and performs low voltage operation can be realized.

It is preferred that the method of manufacturing the semiconductor laser device further comprises forming a light-guiding layer by forming a semiconductor layer in which InGaN and GaN are periodically arranged between the light-emitting layer and the second semiconductor layer, wherein said forming of the light-guiding layer includes forming the light-guiding layer by performing crystal growth of the InGaN at a lower temperature than for the GaN.

With this structure, the crystal growth temperatures of InGaN and GaN are respectively underwent optimization and uniform InGaN with good crystallinity can be realized. Accordingly, the problem of degradation of crystallinity due to In deviation at the time of forming the InGaN light-guiding layer is solved, and the internal loss of light in the InGaN light-guiding layer is reduced as the result. Therefore, the blue-violet semiconductor laser device having low threshold current can be realized.

In the manufacturing method of the semiconductor laser device of the present invention, it is preferred, further in the semiconductor laser device, to form an area above the first semiconductor laser using a metal organic chemical vapor phase epitaxy.

With this structure, in the regrowth above the opening of the current-blocking layer, the crystal growth can be realized so as to embed and planarize the steps of the opening. Therefore, the light-emitting layer having further planarized surface can be realized. As the result, for example, an evenness of the film thickness in the multiple quantum well is improved and the influence of electric field concentration is lost. Therefore, the semiconductor laser device which operates with small series resistance and performs low voltage operation can be realized with good reproducibility.

In the manufacturing method of the semiconductor laser device of the present invention, it is preferred to form an area under the current-blocking layer and the second semiconductor layer of the semiconductor laser device by a metal organic chemical vapor phase epitaxy method, a molecular beam epitaxy method, and a hydride growth method or a combination thereof.

With this structure, if a primary layer that is thick as 100 μm or more is formed by the hydride phase growth method under the current-blocking layer, the crystal defects density is reduced in the primary layer so that a longer-lived semiconductor laser device can be realized. Further, in the case where a thin film buffer layer is inserted for the purpose of moderating a lattice-mismatching between the substrate and a semiconductor layer which forms the semiconductor laser device, it is formed using the molecular beam epitaxy and the thick semiconductor layer can be formed with good reproducibility. Therefore, the semiconductor laser device which operates with small series resistance and performs low voltage operation can be realized with good reproducibility.

As described in the above, according to the semiconductor laser device of the present invention and the method thereof, the design margin for obtaining a stable high-output single lateral mode laser can be increased by restraining the generation of kink in the current—light output characteristics at the time of high-output operation. Also, the design margin in the laser structure designing of a low-noise semiconductor laser device of a self-oscillation type can be increased by precisely controlling the difference of refractive indexes between the light-guiding layer and the blocking layer. Further, the interface resistance at the regrowth area is lowered and the electrode area on the p-type GaN layer can be increased so that series resistance can be reduced and low voltage operation can be performed. Furthermore, a vertical divergence angle $\theta_v$ can be designed to be smaller while keeping a light confinement coefficient $\Gamma_v$ that is vertical to the active layer by setting a difference of refractive indexes in the cladding layer, for example, by forming an n-type AlGaN cladding layer below the n-type GaN cladding layer. Therefore a semiconductor laser device with low threshold current which can obtain high characteristic of beam usage efficiency in the optical disc usage can be realized.

For further information about technical background to this application, the disclosure of Japanese Patent Application No. 2004-182652 filed on Jun. 21, 2004 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

Hereafter, a semiconductor laser device according to embodiments of the present invention and the manufacturing method thereof are described with references to drawings.

First Embodiment

Figure 1:
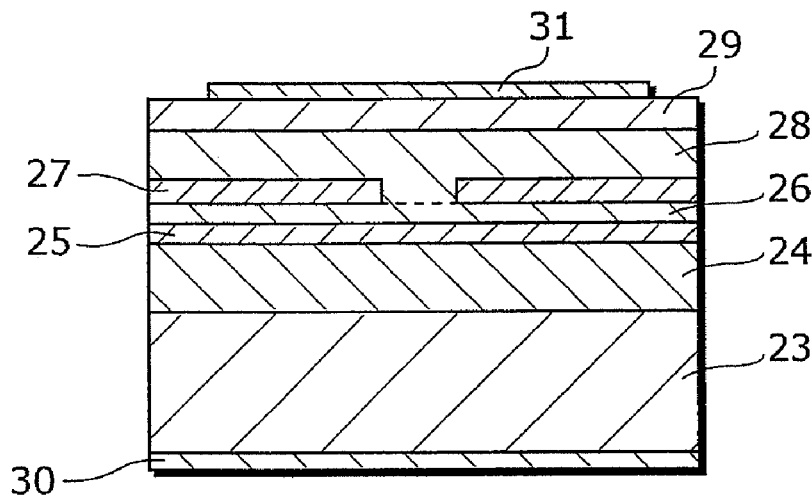
FIG. 1 is a cross-section diagram of an infrared semiconductor laser in the related art.
Figure 2:
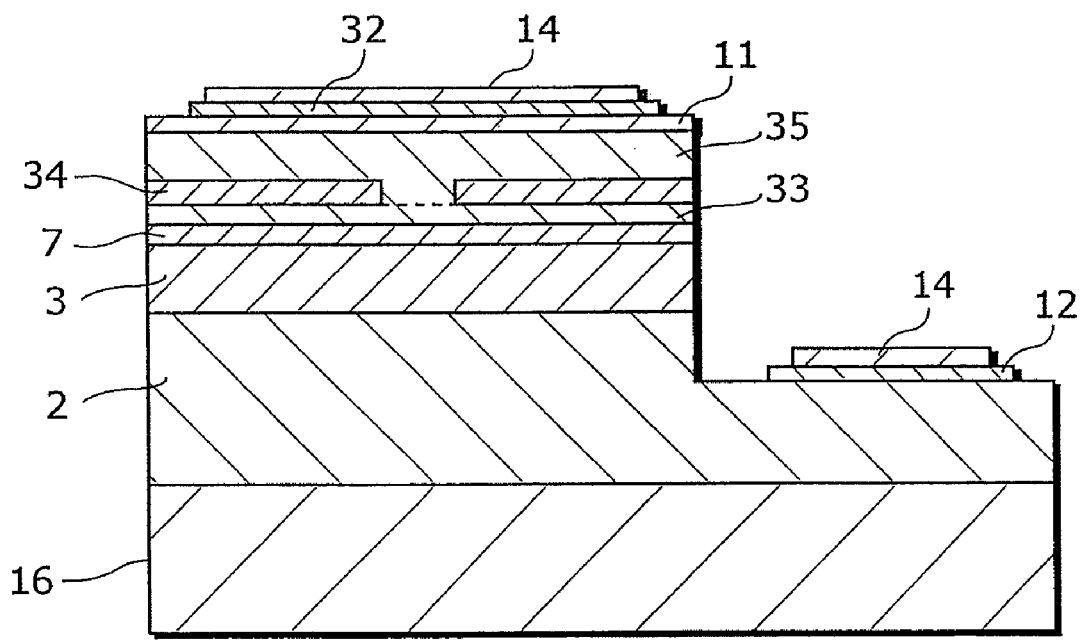
FIG. 2 is a cross-section diagram of a blue-violet semiconductor laser in the related art.
Figure 3:
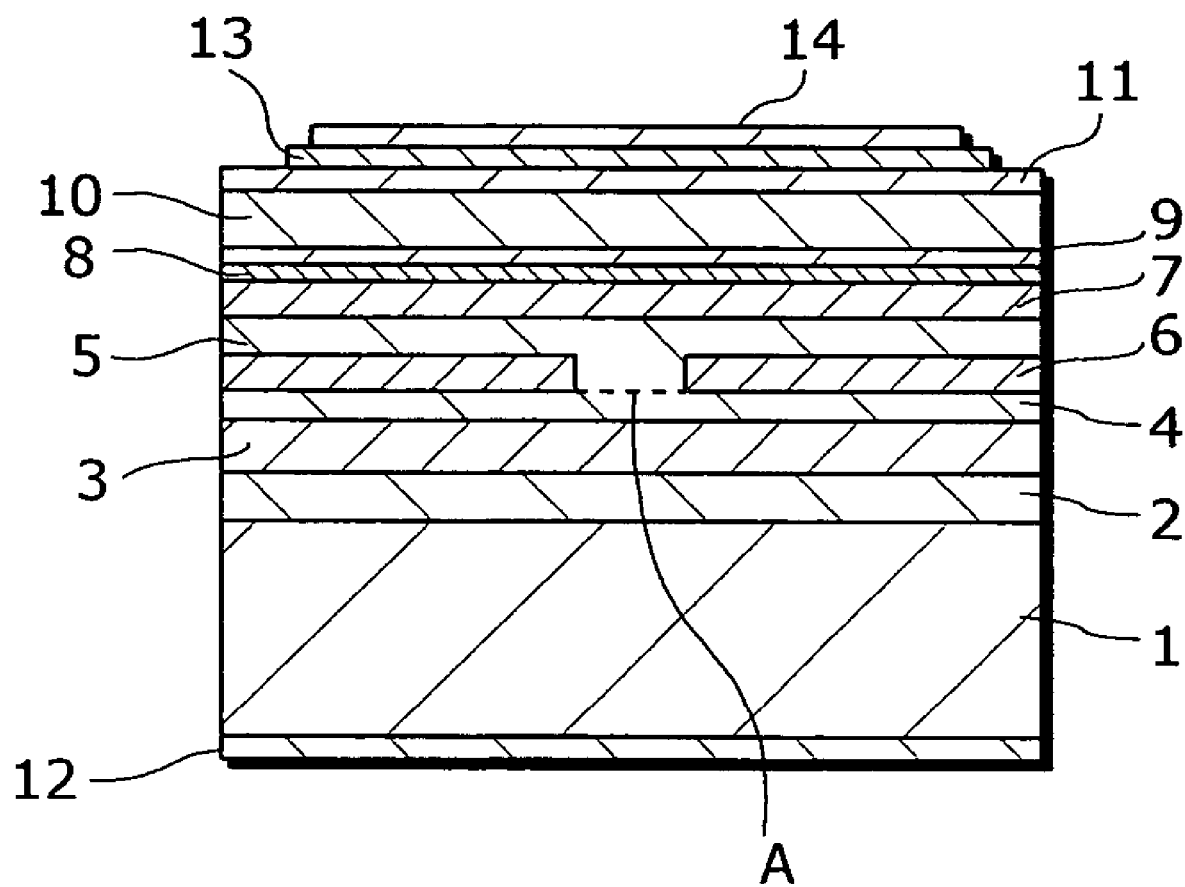
FIG. 3 is a cross-section diagram showing a semiconductor laser in the first embodiment of the present invention.

FIG. 3 is a cross-section diagram of a GaN blue-violet semiconductor laser device according to the first embodiment of the present invention.

The semiconductor laser device has a GaN substrate 1, an n-type GaN layer 2, an n-type AlGaN cladding layer 3, a first n-type GaN guiding layer 4, a second n-type GaN guiding layer 5, a p-type AlGaN blocking layer 6, an InGaN multiple quantum well active layer 7, an undoped GaN guiding layer 8, a p-type AlGaN electron overflow suppression layer 9, a p-type AlGaN cladding layer 10, a p-type GaN contact layer 11, a Ti/Al/Ni/Au ohmic electrode 12, a Ni/Pt/Au ohmic electrode 13, and a Ti/Au pad electrode 14. It should be noted that the first n-type GaN guiding layer 4 and the second n-type GaN guiding layer 5 are examples of the semiconductor layers of the present invention. In other words, the first n-type GaN guiding layer 4 is an example of the first semiconductor layer of the present invention and the second n-type GaN guiding layer 5 is an example of the second semiconductor layer of the present invention. Further, the InGaN multiple quantum well active layer 7 is an example of a light-emitting layer of the present invention and the p-type AlGaN blocking layer 6 is an example of a current-blocking layer of the present invention.

As shown in FIG. 3, the semiconductor laser device has a laser structure of the blue-violet semiconductor laser device using the nitride semiconductor constructed by forming the p-type AlGaN blocking layer 6 below the InGaN multiple quantum well active layer 7 and re-growing the second n-type GaN guiding layer 5 on the first n-type GaN guiding layer 4. In this laser structure, the following layers are formed on the GaN substrate 1: the n-type GaN layer 2; the n-type AlGaN cladding layer 3; the first n-type GaN guiding layer 4 and the p-type AlGaN blocking layer (current-blocking layer ) 6. Further, a striped opening is formed in a portion of the p-type AlGaN blocking layer 6 by etching. The following layers are then formed in order to cover the opening: the second n-type GaN guiding layer 5; the InGaN multiple quantum well active layer 7; the undoped GaN guiding layer 8; the p-type AlGaN electron overflow suppression layer 9; the p-type AlGaN cladding layer 10; and the p-type GaN contact layer 11. The Ti/Al/Ni/Au ohmic electrode 12 is formed on the rear surface of the GaN substrate 1. The Ni/Pt/Au ohmic electrode 13 and the Ti/Au pad electrode 14 are formed on the p-type GaN contact layer 11. A blue-violet light of 405 nm is emitted from the InGaN multiple quantum well active layer 7 by applying current. The impurities of Si and Mg are respectively doped in the n-typed layers and the p-typed layers. The inside of the striped etched opening of the p-type AlGaN blocking layer 6, that is, a portion in which the second n-type GaN guiding layer 5 is embedded has a larger refractive index than the p-type AlGaN blocking layer 6. It functions as a waveguide of the blue-violet semiconductor laser device, which confine the light on the side of the second n-type GaN guiding layer 5 according to the difference of refractive indexes of two layers.

Herein, the difference of the refractive indexes between the second n-type GaN guiding layer 5 and the p-type AlGaN blocking layer 6 in the opening can be precisely controlled in the $10^{-3}$ range by changing an Al composition of the p-type AlGaN blocking layer 6. Therefore, a generation of kink in the current-light output characteristics by spatial hole burning at the time of high-output operation is controlled and a design margin for obtaining a stable high-output single transverse mode laser can be increased. Also, the internal loss of light is minimized as much as possible by increasing the Al composition of the p-type AlGaN blocking layer 6 and preventing the absorption of the blue-violet light emission (about 405 nm). As the result, the blue-violet semiconductor laser device can be realized with low threshold current and low operational current. Further, the consumption power of the semiconductor laser device can be largely reduced so that the longevity of the semiconductor laser device can be achieved as well. Furthermore, the design margin of the semiconductor laser device can be increased when the same structure is applied to a low-noise semiconductor laser device of a self-oscillation type by precisely controlling the difference of the refractive indexes.

In the semiconductor device of the real refractive index waveguide type, which is previously reported in the laser structure of the conventional GaAs or InGaAlP infrared semiconductor laser devices, a method of re-growing the p-type cladding layer on the p-type guiding layer is used. However, when the method is applied to a nitride semiconductor, an interface resistance becomes stronger so that the operational voltage of the semiconductor laser device is increased. The reason is as follows. The refractive index of the p-type GaN layer depends on the Mg concentration, and if the concentration exceeds the $5 \times 10^{19} cm^{-3}$ range, the resistivity becomes rapidly high. Therefore, Mg is redistributed around a regrowth interface (indicated as A in FIG. 3), causing an area where has a high Mg concentration. As the result, a high resistance area is formed around the regrowth interface. In the laser structure of the GaN blue-violet semiconductor laser device according to the present invention, the n-type GaN layer is re-grown on the n-type GaN layer so that the Si doped n-type layer does not become high resistant even the amount of Si doping is increased too much. Consequently, a high resistance layer such as the described p-type layer is not formed and the resistance at the regrowth interface becomes small. Therefore, the GaN blue-violet semiconductor laser device with low operational voltage can be realized. For example, in the case where the Si concentration at the top surface of the first n-type GaN guiding layer 4 before the regrowth is increased to $4 \times 10^{18} cm^{-3}$, an impurity distribution having a peak of $4 \times 10^{18} cm^{-3}$ is formed around the regrowth interface and the resistance around the regrowth interface can be reduced.

In the case where the Al composition in the p-type AlGaN blocking layer 6 into which Mg is doped is relatively small, the internal loss of light in the p-type AlGaN blocking layer 6 by the internal absorption cannot be ignored. In this case, high resistance may be achieved by doping an impurity having low impurity level such as Be into the p-type AlGaN blocking layer 6.

The GaN blue-violet semiconductor laser device according to the present invention can have a larger electrode area on the p-type GaN layer than a ridge-type semiconductor laser device that has been reported as a conventional nitride semiconductor laser device. Therefore, a series resistance in the present GaN blue-violet semiconductor laser device becomes smaller than the conventional semiconductor laser device so that a semiconductor laser device which performs low-voltage operation can be realized.

It should be noted that, in the GaN blue-violet semiconductor laser device in the present embodiment, a laser structure is formed on the GaN substrate. However, the laser structure may be formed on another substrate if the dislocation density in the $10c^6 m^{-2}$ range can be realized in the striped area of the waveguide. As a method of forming a striped waveguide with low dislocation density, there is a method of forming a striped waveguide in an area that is formed by forming the low dislocated area using an Epitaxial Lateral Overgrowth (ELOG) on an insulating film such as for example $SiO_2$, that is patterned in stripes. Therefore, in the GaN blue-violet semiconductor laser device according to the present invention, the semiconductor laser structure may be formed on an AlN layer with, for example, a thick-layer formed on the sapphire substrate, and the striped waveguide may be formed by lowering a dislocation density of the striped waveguide using the method.

Here, the p-type AlGaN blocking layer 6 is made of $Al_{0.15}Ga_{0.85}N$ of the thickenss of 200 nm and $Al_{0.3}Ga_{0.7}N$ of the thickness of 10 nm so as to have the $Al_{0.3}Ga_{0.7}N$ on the top surface layer. The p-type AlGaN blocking layer 6 is formed, when it is formed using the MOCVD method, by stopping the supply of Mg source before forming $Al_{0.3}Ga_{0.7}N$, controlling the diffusion of Mg on the top surface of the p-type AlGaN blocking layer 6, and preventing the diffusion of Mg to the InGaN multiple quantum well active layer 7. Here, the concentration of Mg in the p-type AlGaN blocking layer 6 may be determined in $1 \times 10^{19} cm^{-3}$ or less, a generation of crystal defect such as a point defect in the p-type AlGaN blocking layer 6 is restrained and crystallinity may be increased in the InGaN multiple quantum well active layer 7. Further, the kink level may be controlled by co-doping Si into the p-type AlGaN blocking layer 6 and controlling an internal loss of light by an absorption in the p-type AlGaN blocking layer 6. Therefore, the level of freedom of designing a high-output semiconductor laser device can be increased.

Also, in the case where the second n-type GaN light-guiding layer 5 and the InGaN multiple quantum well active layer 7 are formed on the opening of the p-type AlGaN blocking layer 6, in the formation of the second n-type GaN light-guiding layer 5, the second n-type GaN light-guiding layer 5 is thinned and its top surface is planarized by setting conditions: for example, setting a growth temperature at 1050° C. or higher, controlling the ratio of supplying the III group material and V group material, or reducing the growth speed. It should be noted that after the second n-type GaN light-guiding layer 5 is formed, the second n-type GaN light-guiding layer 5 may be planarized by gas-etching the surface using $Cl_2$ gas or $H_2$ gas and the like or by polishing, and further by epitaxially growing the active layer.

Accordingly, in the present embodiment, the laser structure is formed by forming a striped opening in the p-type AlGaN blocking layer 6 formed on the first n-type GaN guiding layer 4 and further by re-growing the second n-type GaN guiding layer and the InGaN multiple quantum well active layer 7. Therefore, a high-output operational GaN blue-violet semiconductor laser device with a stable single transverse mode or a low-noise GaN blue-violet semiconductor laser device of self-oscillation type are realized and the design margin can be increased. Further, a long-lived GaN blue-violet semiconductor laser device which performs low-voltage operation can be realized by largely reducing the interface resistance and the series resistance around the regrowth interface.

Figure 4:
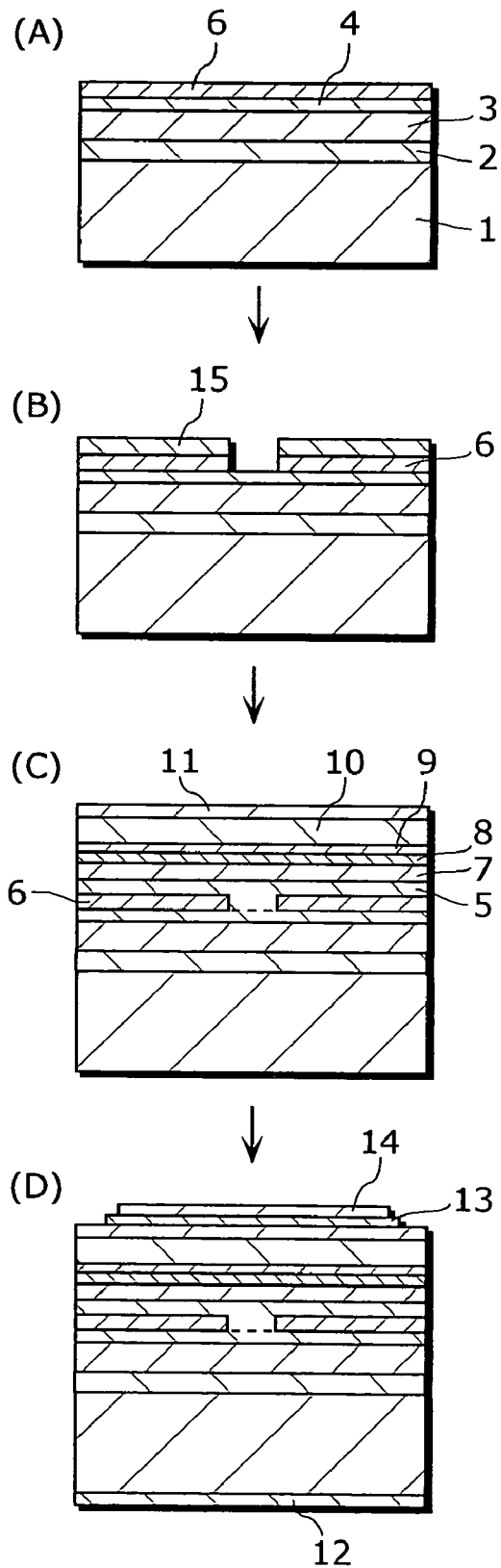
FIG. 4 is a cross-section diagram showing a manufacturing method of the semiconductor laser in the first embodiment of the present invention.

As a manufacturing method of the GaN blue-violet semiconductor laser device shown in FIG. 3 having the above mentioned structure, for example, there is a manufacturing method shown in FIG. 4. FIG. 4 is a series of cross-section diagrams of the GaN blue-violet semiconductor laser device, showing a manufacturing method of the GaN blue-violet semiconductor laser device according to the first embodiment of the present invention.

First, the following layers are formed sequentially on a (0001) basal plane of the n-type GaN substrate 1 whose dislocation density is in the $10^6 cm^{-2}$ range using a Metal Organic Chemical Vapor Deposition (MOCVD) method: the n-type GaN layer 2; the n-type AlGaN cladding layer 3; the first n-type GaN guiding layer 4; and the p-type AlGaN blocking layer 6 (FIG. 4(A)).

Next, a photoresist 15 is formed on the p-type AlGaN blocking layer 6 so as to have a striped opening. A width of the stripe is about 2 μm. Using the photoresist 15 as a mask, the p-type AlGaN blocking layer 6 is selectively removed for example by dry etching called Inductive Couple Plasma (ICP) etching using $Cl_2$ gas (FIG. 4(B)).

Then, after the photoresist 15 is removed, the following layers are sequentially formed in the striped opening and on the p-type AlGaN blocking layer 6 using the MOCVD method: the second n-type GaN guiding layer 5; the InGaN multiple quantum well active layer 7; the undoped GaN guiding layer 8; the p-type AlGaN electron overflow suppression layer 9; the p-type AlGaN cladding layer 10; and the p-type GaN contact layer 11 (FIG. 4(C)). After this regrowth process, the Ni/Pt/Au ohmic electrode 13 is formed on the surface of the p-type GaN contact layer 11 as an ohmic electrode by for example an electron beam vapor deposition and a lift-off method. Following that, sintering is performed for example at 600° C. in $N_2$ atmosphere in order to reduce contact resistance between the Ni/Pt/Au ohmic electrode 13 and the p-type layer. Further, after the Ni/Pt/Au ohmic electrode 13 is formed, the Ti/Au pad electrode 14 is formed on the Ni/Pt/Au ohmic electrode 13.

Lastly, the GaN substrate 1 is polished from its rear surface until it becomes as thin as about 150 μm and the Ti/Al/Ni/Au ohmic electrode 12 is further formed on the rear surface of the n-type GaN substrate 1 using for example the electron beam vapor deposition and the lift-off method (FIG. 4(D)). Thus, the GaN blue-violet semiconductor laser shown in FIG. 3 is formed.

Using such manufacturing method of the semiconductor laser device, the laser structure as shown in FIG. 3 is formed by re-growing the second n-type GaN guiding layer 5 and the InGaN multiple quantum well active layer 7 on the first n-type GaN guiding layer 4 and the laser structure as shown in FIG. 3 is formed. Consequently, in the GaN blue-violet semiconductor laser device, the interface resistance and the series resistance on the regrowth interface are largely reduced and the lower voltage operation and longevity of the semiconductor laser device can be realized.

Also, the light emitting from the InGaN multiple quantum well active layer 7 is confined in the second n-type GaN guiding layer 5 without having the internal loss by the difference of the refractive indexes between the second n-type GaN guiding layer 5 formed by regrowth of the layers and the p-type AlGaN blocking layer 6. Therefore, while realizing a GaN blue-violet semiconductor laser device for high-output operation with a stable single transverse mode or a low-noise GaN blue-violet semiconductor laser device with a self-oscillation type, the design margin can be increased.

Further, in the case where the active layer of the semiconductor laser device is formed in the InGaN multiple quantum well and the blue-violet semiconductor laser device is manufactured, at the time of embedding regrowth, In in the active layer is migrated at above of the opening depending on a growth condition and the In composition is reduced in the semiconductor layer above the p-type AlGaN blocking layer 6. Accordingly, for example, in the case where the GaN guiding layer is formed below the active layer, the crystal growth can be performed in a small lattice-mismatching with GaN. Therefore, the semiconductor layer formed by the regrowth is superior in the crystallinity so that the long-lived GaN blue-violet semiconductor laser device can be realized.

Also, in the case where the active layer of the semiconductor laser device is formed in the AlGaN multiple quantum well and a blue-violet semiconductor laser device which emits light for example in 360 nm is manufactured, at the time of embedding regrowth, Ga is migrated at above the opening so that the Al composition above the opening becomes small. Accordingly, the light can be confined in a lateral direction in the active layer. As the result, efficient light confinement can be realized even the thickness of the AlGaN blocking layer is thinned and the GaN blue-violet semiconductor laser device with low threshold current can be realized.

Furthermore, the first n-type GaN guiding layer 4 and the second n-type GaN guiding layer 5 may be respectively made up of semiconductor layers having different compositions and materials. For example, the first n-type GaN guiding layer 4 can be an n-type guiding layer made of $In_xGa_{1-x}N$ ($0 \leq x \leq 1$), and the second n-type GaN guiding layer 5 can be an n-type guiding layer made of GaN. Consequently, by using the light-guiding layer made of InGaN having a large refractive index than GaN, the light confinement coefficient in a vertical direction can be bigger and the GaN blue-violet semiconductor laser with low threshold current can be realized.

Second Embodiment

Figure 5:
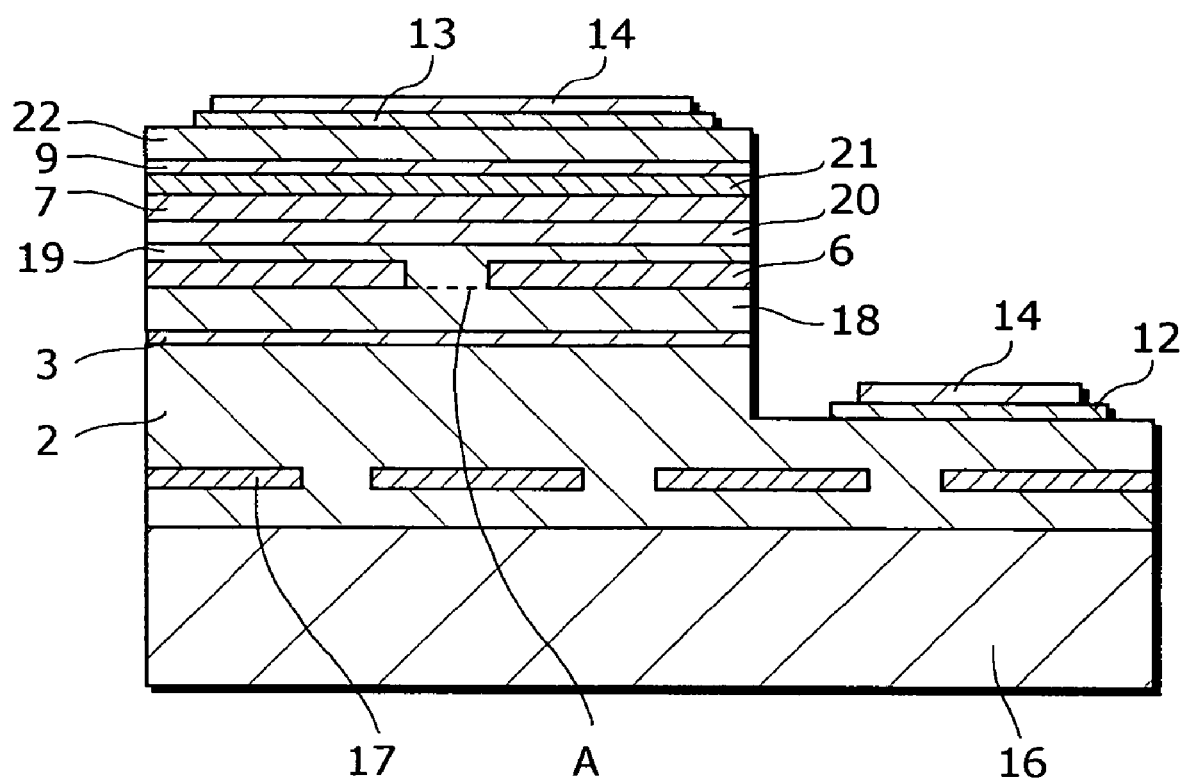
FIG. 5 is a cross-section diagram showing a semiconductor laser in the second embodiment of the present invention.

FIG. 5 is a cross-section diagram of the GaN blue-violet semiconductor laser device according to the second embodiment of the present invention.

The semiconductor laser device has an n-type GaN layer 2, an n-type AlGaN cladding layer 3, a p-type AlGaN blocking layer 6, an InGaN multiple quantum well active layer 7, a p-type AlGaN electron overflow suppression layer 9, a Ti/Al/Ni/Au ohmic electrode 12, a Ni/Pt/Au ohmic electrode 13, a Ti/Au pad electrode 14, a Sapphire substrate 16, a $SiO_2$ mask 17, a first n-type GaN cladding layer 18, a second n-type GaN cladding layer 19, an n-type InGaN guiding layer 20, an undoped InGaN guiding layer 21, and a p-type GaN cladding layer 22. It should be noted that the first n-type GaN cladding layer 18 and the second n-type GaN cladding layer 19 are examples of the semiconductor layers of the present invention. The first n-type GaN cladding layer 18 is an example of the first semiconductor layer of the present invention and the second n-type GaN cladding layer 19 is an example of the second semiconductor layer of the present invention.

As shown in FIG. 5, the semiconductor laser device has a laser structure constructed by forming the p-type AlGaN blocking layer 6 below the InGaN multiple quantum well active layer 7 and re-growing the second n-type GaN cladding layer 19 on the first n-type GaN cladding layer 18, and the laser structure is of a blue-violet semiconductor laser device using nitride semiconductors. In the laser structure, a portion of the n-type GaN layer 2 is formed on the Sapphire substrate 16, the $SiO_2$ mask 17 of its width of 10 μm having a striped opening of for example 5 μm on the portion of the n-type GaN layer 2, and further the rest of the n-type GaN layer 2 is formed on the $SiO_2$ mask 17 by lateral growth. In the semiconductor layer above the $SiO_2$ mask 17, the dislocation density that is in the $10^9 cm^{-2}$ range in the semiconductor layer below the opening is reduced in the $10^6 cm^{-2}$ range. The following layers are formed on the n-type GaN layer 2: the n-type AlGaN cladding layer 3; the first n-type GaN cladding layer 18; and the p-type AlGaN blocking layer (current blocking layer) 6. Further, a striped opening is formed in a portion of the p-type AlGaN blocking layer 6 by etching. Then, the following layers are formed so as to cover the opening: the second n-type GaN cladding layer 19; the n-type InGaN guiding layer 20; the InGaN multiple quantum well active layer 7; the undoped InGaN guiding layer 21; the p-type AlGaN electron overflow suppression layer 9; and the P-type GaN cladding layer 22.

The epitaxial growth layers from the n-type GaN layer 2 to the p-type GaN cladding layer 22 are selectively removed so that the n-type GaN layer 2 is exposed. The Ti/Al/Ni/Au ohmic electrode 12 is formed on the exposed n-type GaN layer 2, and the Ni/Pt/Au ohmic electrode.13 and the Ti/Au pad electrode 14 are formed on the top of the p-type GaN cladding layer 22. The impurity Si is doped into the n-type layers and the impurity Mg is doped into the p-type layers. The opening of the striped etched p-type AlGaN blocking layer 6 is placed above the $SiO_2$ mask 17, where has a small dislocation density. Similar to the first embodiment, inside the opening of the striped etched p-type AlGaN blocking layer 6, that is an area in which the second n-type GaN cladding layer 19 is embedded, has higher refractive index than that of the p-type AlGaN blocking layer 6, and functions as a waveguide of the blue-violet semiconductor laser device which confines the light at the side of the second n-type GaN cladding layer 19 by a difference of two refractive indexes. Also, the second n-type GaN cladding layer 19 is thinned and the top surface is planarized by setting conditions for crystal growth, polishing or etching. Furthermore, the first n-type GaN cladding layer 18 and the second n-type GaN cladding layer 19 have an impurity distribution which the impurity concentration becomes highest on the interface, that is on a regrowth interface.

Herein, the difference of refractive indexes between, in the opening, the second n-type GaN cladding layer 19 and the p-type AlGaN blocking layer 6 can be precisely controlled in the $10^{-3}$ range by changing the Al composition of the p-type AlGaN blocking layer 6. Therefore, the generation of kink in the current-light output characteristics by the spatial hole burning at the time of high-output operation is controlled and the design margin for obtaining a stable high-output single transverse mode can be increased. Also, the internal loss of light is minimized as much as possible by increasing the Al composition of the p-type AlGaN blocking layer 6 and preventing the absorption of the blue-violet light emission (about 405 nm). As the result, the low threshold current and low operational current can be realized in the blue-violet semiconductor laser device. Further, the consumption power of the semiconductor laser device can be largely reduced so that the longevity of the semiconductor laser device can be achieved as well. Furthermore, the design margin of the semiconductor laser device can be increased when the same structure is applied to a low noise semiconductor laser device of a self-oscillation type by precisely controlling the difference of the refractive indexes.

In the semiconductor laser device for optical disc system, it is necessary to minimize a beam divergence angle in a vertical direction (hereafter referred to as vertical divergence angle) $\theta_v$ in the active layer in order to improve light-collectivity of the laser source while realizing low threshold current by maintaining a light confinement coefficient $\Gamma_v$ in the vertical direction in the active layer high. In general, when more light is confined by decreasing the refractive index of the cladding layer, $\Gamma_v$ becomes larger and the threshold current becomes small. However, the vertical divergence angle becomes larger at the same time. In the blue-violet semiconductor laser device shown in the present embodiment, for example, the n-type InGaN guiding layer 20 and undoped InGaN guiding layer 21 that are composed of $In_{0.02}Ga_{0.98}N$ are formed above and under the InGaN multiple quantum well active layer 7. The second n-type GaN cladding layer 19 and the p-type GaN cladding layer 22 are respectively formed outside the n-type InGaN guiding layer 20 and the undoped InGaN guiding layer 21. Further, for example, the first n-type GaN cladding layer 18 composed of an n-type $Al_{0.1}Ga_{0.9}N$ layer is formed under the second n-type GaN cladding layer 19. Thus, by setting a difference of the refractive indexes further in the cladding layers, in other words, by setting a difference of the refractive indexes among the n-type AlGaN cladding layer 3, the first n-type GaN cladding layer 18 and the second n-type GaN cladding layer 19, it is possible to design a structure having a smaller vertical divergence angle θ while maintaining high confinement coefficient $\Gamma_v$. Therefore, a semiconductor laser device with low threshold current which can obtain high beam usage efficiency in the optical disc system application can be realized.

The n-type InGaN guiding layer 20 that is composed of $In_{0.02}Ga_{0.98}N$ may have a periodic structure of, for example, InGaN/GaN in which InGaN and GaN are periodically arranged, for the purpose of controlling an In composition segregation by thickening the layer or by moderating the difference of lattice constants between GaN and InGaN. In this case, the periodic structure is formed by epitaxially growing InGaN at a lower temperature than GaN. Therefore, the crystallinity of the InGaN multiple quantum well active layer 7 formed on the n-type InGaN guiding layer 20 is improved and the semiconductor laser device for low threshold current can be realized.

In the semiconductor laser device according to the first embodiment, the AlGaN layer and the GaN layer are respectively used for the cladding layer and the guiding layer. In general, the AlGaN layer is assumed that it needs to be as thick as 1 μm, and there is a problem that a crack is likely to be cause by the lattice-mismatching between AlGaN and GaN. However, in the semiconductor laser device according to the second embodiment, the crack generation by the lattice-mismatching can be prevented by forming the most part of the cladding layer with GaN.

It should be noted that in the GaN blue-violet semiconductor laser device in the present embodiment, it is described about the laser structure in which a low dislocation density area is formed on the sapphire substrate by the lateral growth and the striped waveguide is formed on the low dislocation density area. However, the laser structure of the present invention is not limited to such laser structure as long as the dislocation density in the $10^6 cm^{-2}$ range can be realized in the striped waveguide area. The laser structure can be a structure in which the striped waveguide is formed on the GaN substrate. Also, the laser structure may be formed on a thick AlN layer formed on the sapphire substrate, that is, where dislocation density is lowered.

Further, the first n-type GaN cladding layer 18 and the second n-type GaN cladding layer 19 may be semiconductor layers that have different compositions or materials. For example, the first n-type GaN cladding layer 18 may be an n-type cladding layer composed of $In_xGa_{1-x}N$ (0≦x≦1), and the second n-type GaN cladding layer 19 may be an n-type cladding layer composed of GaN. Consequently, the light confinement coefficient in a vertical direction can be bigger by using a cladding layer composed of InGaN that has larger refractive index than GaN. Therefore, the semiconductor laser with low threshold current can be realized.

Figure 6:
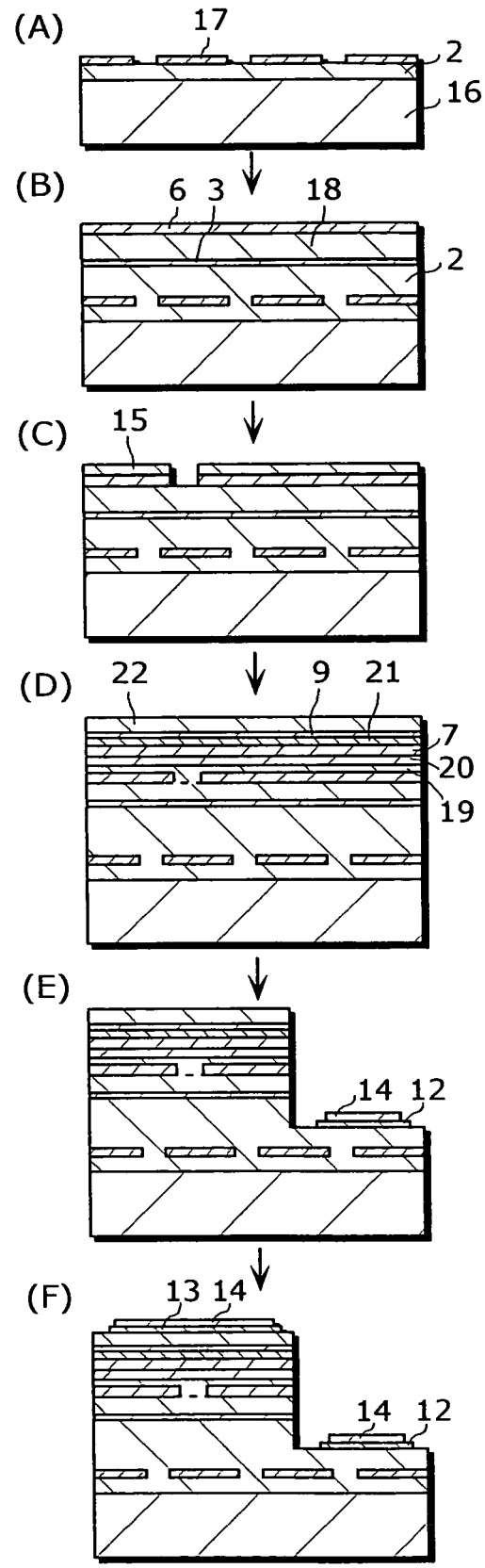
FIG. 6 is a cross-section diagram showing a manufacturing method of the semiconductor laser in the second embodiment of the present invention.

As a method of manufacturing the GaN blue-violet semiconductor laser device shown in FIG. 5 having such structure, for example, there is a manufacturing method shown in FIG. 6. FIG. 6 is a cross-section diagram of the GaN blue-violet semiconductor laser device, showing a manufacturing method of the GaN blue-violet semiconductor laser device in the second embodiment of the present invention.

First, the n-type GaN layer 2 is formed, for example, on a (0001) basal plane of the sapphire substrate 16. Then, the $SiO_2$ film 17 is formed in the thickness of about 100 nm using a Chemical Vapor Deposition (CVD) method with $SiH_4$ and $O_2$ gas on the n-type GaN layer 2. Following that, the $SiO_2$ film 17 is selectively etched with hydrogen fluoride (HF) solution using the photoresist as a mask so as to form $SiO_2$ stripes of the width of 10 μm having striped openings of the width of 5 μm in the $SiO_2$ film 17 (FIG. 6(A)).

Next, the n-type GaN layer 2, the n-type AlGaN cladding layer 3, the first n-type GaN cladding layer 18 and the p-type AlGaN blocking layer (current-blocking film) 6 are formed using, for example, a MOCVD method in order to grow these layers from the n-type GaN layer 2 in the openings of the SiO$_2$ film 17 (FIG. 6(B)). In the crystal growth process by the MOCVD method, the crystal grows so as to grow in a lateral direction above the SiO$_2$ film 17 in which the openings are formed. Therefore, the threading dislocation density is largely reduced in the semiconductor layer above the SiO$_2$ film 17. As the result, the semiconductor layer with the dislocation density in the 10$^6$cm$^{-2}$ range can be obtained.

Next, the photoresist 15 is formed so as to have a striped opening on the p-type AlGaN blocking layer 6. The width of the stripe is about 2 μm. Using the photoresist 15 as a mask, the p-type AlGaN blocking layer 6 is selectively removed by dry etching called ICP etching using for example Cl$_2$ gas (FIG. 6(C)).

Then, after removing the photoresist 15, the following layers are subsequently formed using the MOCVD method inside the striped opening and on the p-type AlGaN blocking layer: the second n-type GaN cladding layer 19, the n-type InGaN guiding layer 20; the InGaN multiple quantum well active layer 7; an undoped InGaN guiding layer 21; the p-type AlGaN electron overflow suppression layer 9; and the p-type GaN cladding layer 22 (FIG. 6(D)). After this regrowth, a portion of the epitaxial growth layers from the n-type GaN layer 2 to the p-type GaN cladding layer are selectively removed so that the n-type GaN layer 2 is exposed (FIG. 6(E)). For this etching, a dry etching technology such as the ICP etching is used. Here, the n-type GaN layer 2 is exposed so as to have the opening parallel to the opening pattern of the p-type AlGaN blocking layer 6 that is a striped waveguide.

Next, the Ni/Pt/Au ohmic electrode 13 is formed as an ohmic electrode on the surface of the p-type GaN cladding layer 22 by, for example, the electron beam evaporation and the lift-off method. Then, the Ti/Au pad electrode 14 is formed on the Ni/Pt/Au ohmic electrode 13 after sintering is performed, for example, at 600° C. and in the N$_2$ atmosphere for reducing the contact resistance between the Ni/Pt/Au ohmic electrode 13 and the p-type layer. Further, the Ti/Al/Ni/Au ohmic electrode 12 is formed on the exposed n-type GaN layer 2 by, for example, the electron beam evaporation and the lift-off method, then the Ti/Au pad electrode 14 is formed on the Ti/Al/Ni/Au ohmic electrode 12 on the exposed n-type GaN layer 2 (FIG. 6(F)). Thus, the GaN blue-violet semiconductor laser shown in FIG. 5 is formed.

Using such manufacturing method of the semiconductor laser device, the laser structure as shown in FIG. 5 is constructed by re-growing the second n-type GaN cladding layer 19 and the InGaN multiple quantum well active layer 7 on the first n-type GaN cladding layer 18. Therefore, in the GaN blue-violet semiconductor laser device, the resistance around the regrowth interface (indicated as A in FIG. 5) can be decreased and the low voltage operation and longevity of the semiconductor laser device can be realized.

Further, the light emitted from the InGaN multiple quantum well active layer 7 is confined in the second n-type GaN cladding layer 19 without causing internal loss of light due to the difference of the refractive indexes between the second n-type GaN cladding layer 19 formed by the regrowth and the p-type AlGaN blocking layer 6. Thus, a GaN blue-violet semiconductor laser device for a high-output operation with a stable single transverse mode or a low-noise GaN blue-violet semiconductor laser device with self-oscillation type are realized and the design margin can be increased.

Also, by having two n-type cladding layers of AlGaN and GaN, that is, by forming the n-type AlGaN cladding layer 3 below the first n-type GaN cladding layer 18, a structural design in which a high light confinement coefficient and a small vertical divergence angle are allowed can be realized. Also, a semiconductor laser device for small threshold current with high beam usage efficiency for an optical disc system can be realized. As described in the above, the semiconductor laser device for low operational voltage and low operational current can be realized so that consumption power can be reduced and the blue-violet semiconductor laser device for longevity can be realized.

Although the GaN blue-violet semiconductor laser device according to the present invention and the manufacturing method thereof have been described in detail above based on embodiments, those skilled in the art will readily appreciate that many modifications are possible in the exemplary embodiments without materially departing from the novel teachings and advantages of this invention. Accordingly, all such modifications are intended to be included within the scope of this invention.

For example, the GaN substrate and sapphire substrate may have any plane directions. It may have a plane direction with an off-angle from a representative plane such as (0001) basal plane.

In addition, the substrate may be one of a SiC substrate, a ZnO substrate, a Si substrate, a GaAs substrate, a GaP substrate, an InP substrate, a LiGaO$_2$ substrate, an AlN substrate, a MgO substrate, a LiAlO$_2$ substrate, or an alloy of these. Further, it is desirable that the striped waveguides are formed in an area in which the dislocation density is in 10$^6$cm$^{-2}$ or less. Further, the epitaxial growth layer in which a laser structure is formed may have any ratios of compositions unless desired laser characteristics can be realized, and may have any multilayer structures. Also, it may include a layer formed by a crystal growth such as Molecular Beam Epitaxy (MBE) or Hydride Vapor Phase Epitaxy (HVPE) instead of the MOCVD technique. The epitaxial growth layer by which the laser structure is formed may include V group elements such as As and P or III group elements such as B as composition elements. Further, the blocking layer may have a semi-insulating conductivity type.

INDUSTRIAL APPLICABILITY

The semiconductor laser device according to the present invention can be used as a high-output or low-noise GaN blue-violet semiconductor laser device that can be used as a light source for writing and reading a high-density optical disc system.

What is claimed is:

1. A semiconductor laser device comprising:
   a substrate;
   a current-blocking layer which has an opening and is formed above said substrate, said current-blocking layer being one of a p-type layer and a semi-insulating layer;
   an n-type semiconductor layer formed at least in the opening; and
   a light-emitting layer formed above said current-blocking layer,
   wherein the top surface of said semiconductor layer is substantially flat, and
   said light-emitting layer is formed on said semiconductor layer, contacting with said semiconductor layer.

2. The semiconductor laser device according to claim 1,
   wherein the top surface of said semiconductor layer is planar, and
   said light-emitting layer is formed on said semiconductor layer, contacting with said semiconductor layer.

3. The semiconductor laser device according to claim 2,
   wherein said current-blocking layer has a smaller refractive index than said semiconductor layer.

4. The semiconductor laser device according to claim 3, wherein said current-blocking layer has an area into which two or more types of impurities are doped.

5. The semiconductor laser device according to claim 4, wherein said current-blocking layer is made up of layers which have compositions that are different from each other.

6. The semiconductor laser device according to claim 5, wherein said semiconductor layer includes:

a first semiconductor layer; and a second semiconductor layer formed on said first semiconductor layer, contacting with said first semiconductor layer, said first semiconductor layer is formed between said current-blocking layer and said substrate, said second semiconductor layer is formed between said current-blocking layer and said light-emitting layer, and is formed inside the opening, and said first semiconductor layer has a higher impurity concentration on a side of said light-emitting layer than on a side of said substrate.

7. The semiconductor laser device according to claim 6, wherein a composition of said first semiconductor layer is different from a composition of said second semiconductor layer.

8. The semiconductor laser device according to claim 7, wherein impurity concentrations of said first semiconductor layer and said second semiconductor layer reach a peak at an interface between said first and second semiconductor layers.

9. The semiconductor laser device according to claim 8, wherein said light-emitting layer and said semiconductor layer are made of a compound semiconductor including nitrogen.

10. The semiconductor laser device according to claim 9, wherein said current-blocking layer is doped with magnesium.

11. The semiconductor laser device according to claim 10, wherein a concentration of the magnesium in said current-blocking layer is $1 \times 10^{19}$ cm$^{-3}$ or less.

12. The semiconductor laser device according to claim 11, wherein said semiconductor layer is made of GaN.

13. The semiconductor laser device according to claim 12, wherein said light-emitting layer is made of InGaAlN, and said light-emitting layer has a larger Al composition in an area positioned above said current-blocking layer than in an area positioned above the opening.

14. The semiconductor laser device according to claim 13, wherein said light-emitting layer has a smaller In composition in the area positioned above said current-blocking layer than in the area positioned above the opening.

15. The semiconductor laser device according to claim 8, wherein said first semiconductor layer is made of $In_xGa_{1-x}N$, where $0 \leq x \leq 1$, and said second semiconductor layer is made of GaN.

16. The semiconductor laser device according to claim 5, wherein said current-blocking layer is made up of a first $Al_xGa_{1-x}N$ layer and a second $Al_yGa_{1-y}N$ layer formed on the first $Al_xGa_{1-x}N$ layer, where $0 \leq x \leq 1$, $0 \leq y \leq 1$ and $x < y$.

17. The semiconductor laser device according to claim 4, wherein said current-blocking layer is made of $Al_xGa_{1-x}N$ layer, where $0 \leq x \leq 1$.

18. The semiconductor laser device according to claim 1, wherein said semiconductor layer functions as a cladding layer, and said semiconductor laser device further comprises a light-guiding layer formed between said light-emitting layer and said cladding layer, said light-guiding layer being made of $In_xGa_{1-x}N$, where $0 \leq x \leq 1$.

19. The semiconductor laser device according to claim 18, wherein said light-guiding layer has a periodic structure in which InGaN and GaN are periodically arranged.

20. The semiconductor laser device according to claim 1, wherein the top surface of said semiconductor layer is free of steps and asperities.

21. A semiconductor laser device comprising:

a substrate;

a current-blocking layer which has an opening and is formed above said substrate, said current-blocking layer being one of a p-type layer and a semi-insulating layer;

an n-type semiconductor layer formed at least in the opening; and a light-emitting layer formed above said current-blocking layer, wherein said semiconductor layer comprises:

a first semiconductor layer; and a second semiconductor layer formed on said first semiconductor layer, contacting with said first semiconductor layer, said first semiconductor layer is formed between said current-blocking layer and said substrate, said semiconductor layer is formed between said current-blocking layer and said light-emitting layer, and is formed inside the opening, and said first semiconductor layer has a higher impurity concentration on a side of said light-emitting layer than on a side of said substrate.

* * * * *